United States Patent
Tang

(12) United States Patent    (10) Patent No.: US 7,876,607 B2
Tang    (45) Date of Patent: Jan. 25, 2011

(54) READING THRESHOLD SWITCHING MEMORY CELLS

(76) Inventor: Stephen Tang, 44317 Arapaho Ave., Fremont, CA (US) 94539

( * ) Notice: Subject to any disclaimer, the term of this patent is extended or adjusted under 35 U.S.C. 154(b) by 116 days.

(21) Appl. No.: 12/333,530

(22) Filed: Dec. 12, 2008

(65) Prior Publication Data

US 2010/0149857 A1    Jun. 17, 2010

(51) Int. Cl.
*G11C 11/00* (2006.01)
*G11C 7/02* (2006.01)

(52) U.S. Cl. .................. 365/163; 365/148; 365/208

(58) Field of Classification Search .................. 365/163
See application file for complete search history.

(56) References Cited

U.S. PATENT DOCUMENTS

| | | | |
|---|---|---|---|
| 7,505,334 B1 * | 3/2009 | Breitwisch et al. | 365/189.15 |
| 7,672,176 B2 * | 3/2010 | Chiang et al. | 365/189.16 |
| 2008/0316847 A1 * | 12/2008 | Lin et al. | 365/210.1 |
| 2009/0116280 A1 * | 5/2009 | Parkinson et al. | 365/163 |
| 2009/0147565 A1 * | 6/2009 | Lowrey | 365/163 |

* cited by examiner

*Primary Examiner*—Son L Mai
(74) *Attorney, Agent, or Firm*—Trop, Pruner & Hu, P.C.

(57) ABSTRACT

Using the voltage across a threshold switching cell to sense the state of the cell, rather than sensing current through the cell, may result in a faster read. In some embodiments, current consumption during reading of conductive states may be reduced by using a capacitor coupled across the cell.

19 Claims, 2 Drawing Sheets

READING THRESHOLD SWITCHING MEMORY CELLS

BACKGROUND

This relates generally to threshold switching memory cells, such as phase change memory cells.

A threshold switch with a variable threshold voltage, such as a phase change memory, has a threshold voltage that determines the state of the memory. The threshold voltage may be varied by programming.

Thus, phase change memories may have a set or lower resistance state and a reset or higher resistance state. A cell may switch between set and reset states, for example, in response to programming that applied sufficient current to change the crystallographic structure of the phase change material.

Generally, cells are read by measuring the amount of current. The set cell passes more current and the reset cell passes less current. Thus, the current consumption of the cell in the set state read operation may be relatively high. Basically, the static current is supplied for the duration of the read operation in order to keep the cell in the on state.

DETAILED DESCRIPTION

In accordance with some embodiments, a threshold switch memory may sense voltage, rather than current, using a capacitance that is pre-charged to a voltage that distinguishes between states or levels. After some time has elapsed, the voltage across the capacitor may be compared to a reference voltage to determine the state of the memory. In some embodiments, the current consumption may be reduced, especially when sensing cells in the set state and, in some embodiments, sensing speed may be increased.

Figure 1:
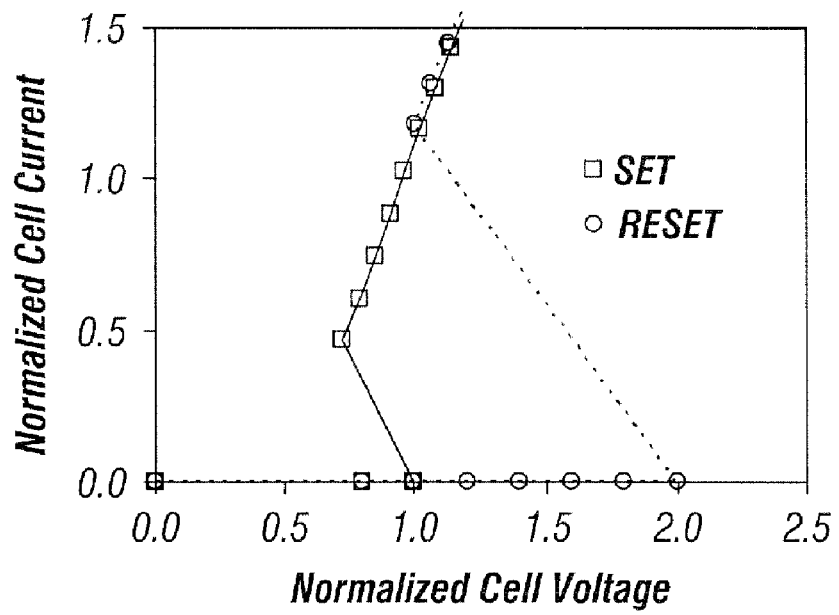
FIG. 1 is a graph of normalized cell current versus normalized cell voltage for a phase change memory in both the set and reset states in arbitrary units.

Referring to FIG. 1, the normalized current-voltage or i-v characteristics of a threshold switch (namely, a phase change memory) are depicted. As normalized cell voltage increases, the normalized current only increases slightly in the reset state until a threshold voltage is reached, which is depicted at 2.0 units in this embodiment. Then, the reset cell snaps back to a much lower voltage and a much higher current. Snapback occurs at about 1.0 units in the set state in this example. The slope of the on-state characteristic is determined by the resistance in series with the cell, i.e. the load-line of external devices. In the off state, before thresholding, the current is much smaller.

In order to read the state of the cell, its threshold voltage is determined. If the sub-threshold current is not high enough for sensing circuitry to detect it reliably, the memory device is thresholded, in some cases, to differentiate between states. For example, a memory having the i-v curve shown in FIG. 1 may be read by placing a normalized voltage of 1.5 units across the cell and using sensing circuitry to determine if a large on state current flows. The detection of a large on state current flow is indicative of the set state. Conversely, a small sub-threshold leakage flow indicates a reset state.

Because threshold switches have higher conductivity in the on state, a series resistance or load line may be added in series to limit the current after thresholding occurs. If the series resistance is too large, the cell may not snap back to a stable point on its i-v curve. As a result, the cell may drop out of the on state or even oscillate. Conversely, if the resistance is too small, the read current may be high enough to damage or reduce the reliability of the cell. These limitations on resistance put design constraints on the read circuitry surrounding the cell and limit the speed of the read operations since, in general, speed is directly related to current.

With an appropriately designed load line, the typical sensing circuitry to determine whether a bit thresholded, compares the current flowing through the cell to a known reference current. The threshold switch memory cell can provide a large current differential between on and off states. Since the current in the on state is relatively large, a significant amount of power is used to read the cell in the set state.

In accordance with some embodiments, a dynamic read scheme may reduce or eliminate the static power requirement and may allow lower resistance load line, expanding the design window, while improving speed in some embodiments. Instead of biasing the cell at a static point on its i-v curve and reading the current, the cell may be allowed to dynamically traverse its i-v curve, with the current integrated and measured as charge taken away from a capacitance coupled in parallel to the cell.

Figure 2:
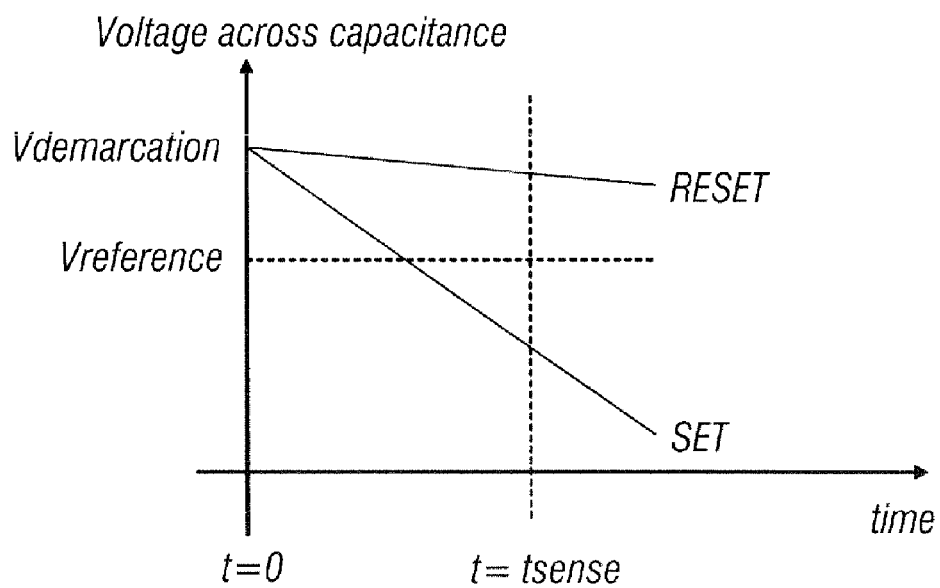
FIG. 2 is a graph of voltage across a capacitance versus time in accordance with one embodiment.

As shown in FIG. 2, the capacitance is initially pre-charged to a demarcation voltage $V_{demarcation}$, which may be a voltage between the threshold voltages associated with the two states of the cell (labeled SET and RESET in FIG. 2) to be distinguished. These states of the cell may also be different levels in a multilevel cell.

At time $t_{sense}$, if the cell is in a lower threshold voltage state, the cell thresholds and drains the capacitance of some of its charge. If the cell is in the higher threshold voltage state, it does not threshold and the capacitance retains its charge (except for any losses due to sub-threshold leakage). Since charge on the capacitance is related to its voltage, the voltage across the capacitance after the read can be compared to a reference voltage to determine the cell state.

Since the capacitance may be pre-charged in one phase and then discharged to the cell in a separate phase, the read operation need not take more energy than it takes to charge up the capacitance C to the voltage V ($CV^2$ in an ideal case, but may take more because the voltage V is most likely derived from a non-ideal, less than perfectly efficient voltage converter). The energy stored in the capacitance is $0.5*CV^2$. Regardless of how large the peak current that flows through the cell, the energy the cell dissipates cannot be higher than $0.5*CV^2$. Thus, the design constraint that conventionally limits the current through the cell may be relaxed in some embodiments.

The time between $t_0$ and $t_{sense}$ may be optimized for particular situations. The less time the system waits until $t_{sense}$, the harder it may be to distinguish between set and reset states. The longer the time to $t_{sense}$, the larger the performance issues that arise and eventually the reset state may start to droop, making it harder to distinguish set and reset states.

In some embodiments, the capacitance may be reduced to minimize the potential for device damage. The energy dissipation in the cell is linearly proportional to the capacitance on the sensing node. The typical case may have a hundred femtoFarads of capacitance charge to 4 volts, which would have a total energy of 8 picoJoules. Also, the leakage current flowing from a reset cell, or a selected bit line in the case of an array, may be significantly smaller than the current from a set cell. A detectable voltage difference will appear on the capacitance.

In some embodiments, the speed of the read operation can be improved. In the case of a static read, the transients that occur if the device thresholds must settle before the read can be completed. In some embodiments, the transient is what the read operation senses. Reducing the capacitance and increasing the conductivity of the cell in the on state directly translates into reduced time needed to develop a voltage difference on the sensing capacitance.

In a conventional phase change memory read, the read voltage must ramp up because it cannot be applied instantaneously. When the read voltage is reached, generally a set bit thresholds and current can go very high. The current that attempts to flow may be greater than the current that can be generated and, as a result, the voltage may droop. In general, because of the snapback that occurs and the high current spike, the current tends to fall because the necessary current cannot be applied. As a result, transients are created. Generally, sensing waits unit these transients settle. However, in accordance with some embodiments of the present invention, the transient is actually what is being measured. Namely, the effect of the cell in pulling charge off of the capacitor or not is what is being detected and this can be detected relatively quickly, without concern about transients.

In some embodiments, it may be advantageous to implement the capacitor 14 using intrinsic, parasitic capacitance of an array of memory cells. Generally, the intrinsic capacitance from bitlines, interconnects, and routing are sufficient to provide the capacitance needed for sensing. This capacitance is generally in parallel to the cell.

Figure 3:
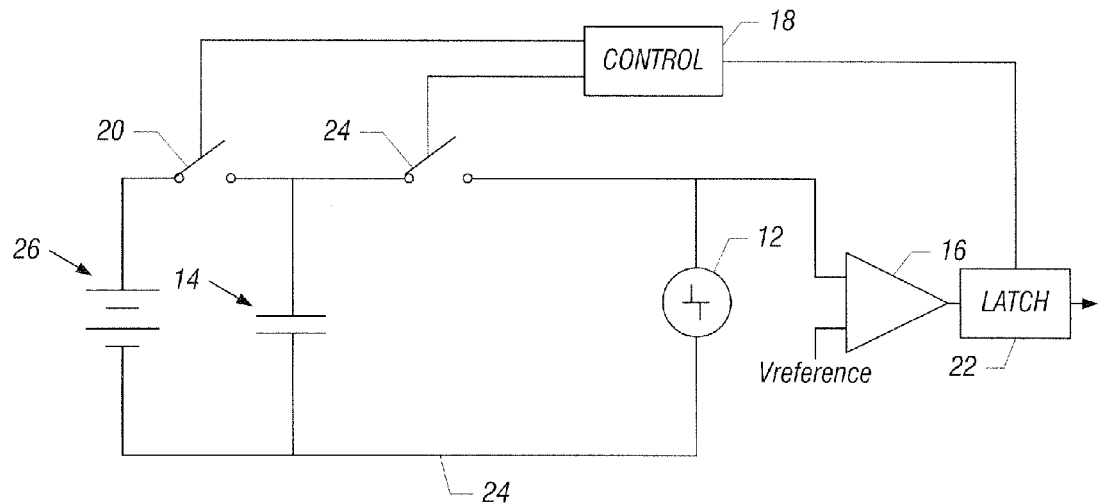
FIG. 3 is a circuit schematic for one embodiment of a read circuit.

Referring to FIG. 3, in accordance with one embodiment, a capacitor 14 may be placed in parallel to the cell 12. A control 18 may be a processor or controller, in accordance with one embodiment, that controls the switches 20 and 24. Thus, the control 18 can open or close the switch 20 to couple the voltage source 26 to charge the capacitor 14, while control 18 disconnects the cell 12 by opening the switch 24 and vice versa.

The control 18 may latch the comparator 16 output at the time $t_{sense}$. The comparator 16 receives, on the other input terminal, a reference voltage intermediate between the capacitor voltage for set and reset or different levels to be sensed. The "output" from the latch 22 is the sensed state.

In some embodiments, the capacitor 14 is pre-charged to the demarcation voltage. At a time zero, the switch 24 is closed and the switch 20 is opened. If the threshold voltage of the cell 12 is less than the demarcation voltage, a large current flows that discharges the capacitor 14 quickly. If the threshold voltage of the cell 12 is higher than the demarcation voltage, leakage current discharges the capacitance very slowly.

At time $T=t_{sense}$, the voltage comparator 16 output may be latched to determine if the capacitance has a voltage greater or less than a fixed reference, indicated in FIG. 3 as $V_{reference}$. Thus, as shown in FIG. 2, $V_{reference}$ is intermediate between the reset and state states, in one embodiment, at the time $T=t_{sense}$.

In some embodiments, the cell 12 may include a select device in series with a phase change memory element. The select device may be a thresholding switching device, known as an ovonic threshold switch. Other select devices include silicon diodes and MOS transistors.

In one embodiment, each select device may comprise a switching material such as, for example, a chalcogenide alloy, and may be referred to as an ovonic threshold switch, or simply an ovonic switch. The switching material of select devices may be a material in a substantially amorphous state positioned between two electrodes that may be repeatedly and reversibly switched between a higher resistance "off" state (e.g., greater than about ten megaOhms) and a relatively lower resistance "on" state (e.g., about one thousand Ohms in series with $V_H$) by application of a predetermined electrical current or voltage potential. In this embodiment, each select device may be a two terminal device that may have a current-voltage (I-V) characteristic similar to a phase change memory element that is in the amorphous state. However, unlike a phase change memory element, the switching material of select devices may not change phase. That is, the switching material of select devices may not be a programmable material, and, as a result, select devices may not be a memory device capable of storing information. For example, the switching material of select devices may remain permanently amorphous and the I-V characteristic may remain the same throughout the operating life.

In the low voltage or low electric field mode, i.e., where the voltage applied across select device is less than a threshold voltage (labeled $V_{TH}$), a select device may be "off" or non-conducting, and exhibit a relatively high resistance, e.g., greater than about 10 megaOhms. The select device may remain in the off state until a sufficient voltage, e.g., $V_{TH}$, is applied, or a sufficient current is applied, e.g., $I_{TH}$, that may switch the select device to a conductive, relatively low resistance on state. After a voltage potential of greater than about $V_{TH}$ is applied across the select device, the voltage potential across the select device may drop ("snapback") to a holding voltage potential, $V_H$. Snapback may refer to the voltage difference between $V_{TH}$ and $V_H$ of a select device.

In the on state, the voltage potential across select device may remain close to the holding voltage of $V_H$ as current passing through select device is increased. The select device may remain on until the current through the select device drops below a holding current, $I_H$. Below this value, the select device may turn off and return to a relatively high resistance, nonconductive off state until the $V_{TH}$ and $I_{TH}$ are exceeded again.

In some embodiments, only one select device may be used. In other embodiments, more than two select devices may be used. As another example, the threshold current of the memory element may be about equal to the threshold current of the access device even though its snapback voltage is greater than the memory element's reset bit threshold voltage.

Figure 4:
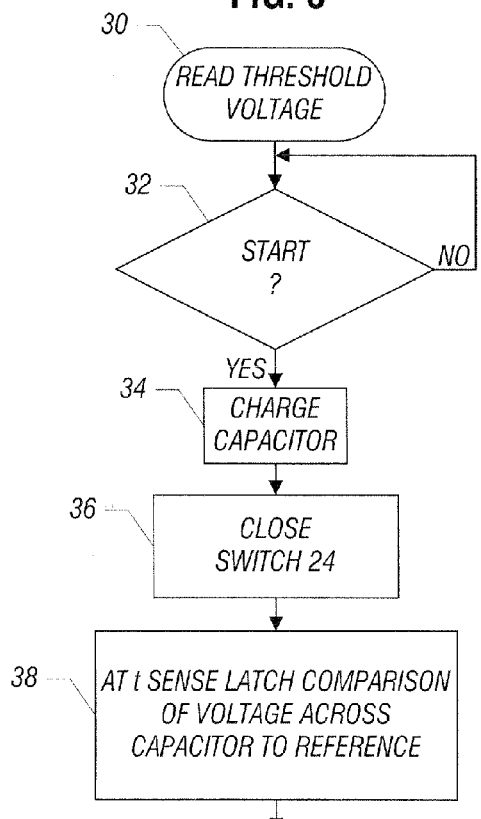
FIG. 4 is a flow chart for the control/timer shown in FIG. 3 in accordance with one embodiment.

Thus, referring to FIG. 4, in accordance with one embodiment, the control 18 may be implemented by hardware, software, or firmware. In a software embodiment, the sequence of FIG. 4 may be implemented by computer readable instructions stored in a memory for execution by a processor or controller such as the control 18.

The sequence implemented by the control/timer 18 begins by determining whether a start indication has been received at diamond 32. If so, the capacitor 14 is charged, as indicated in block 34. It may be charged by closing the switch 20 and using the voltage source 26 to charge the capacitor.

Then, at time $t_{sense}$, the switch 20 is opened and the switch 24 is closed, as indicated in block 36. The voltage across the capacitor 14 is continuously compared to the reference voltage $V_{reference}$ until it is latched, as indicated in block 38.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
reading the state of a phase change threshold switching memory cell using a capacitor coupled in parallel with the cell; and
charging said capacitor to a voltage intermediate between two cell states to be distinguished upon reading the cell.

2. The method of claim 1 including determining the charge on the capacitor after coupling said cell across said capacitor.

3. The method of claim 2 including coupling a node of said capacitor to a voltage comparator and comparing a voltage on the node to a reference voltage.

4. The method of claim 3 including making said comparison after a time period has elapsed since coupling said capacitor to said cell.

5. The method of claim 1 including distinguishing between set and reset phase change memory states.

6. The method of claim 1 including distinguishing between levels of a multilevel cell.

7. The method of claim 1 including using parasitic capacitance as said capacitor.

8. A threshold switching memory comprising:
a phase change memory cell;
a capacitor selectively connectable across said cell;
a comparator to compare a voltage across said capacitor to a reference voltage to determine the state of said cell; and
a charging circuit to charge said capacitor to a level intermediate between two cell states to be distinguished upon reading the cell.

9. The memory of claim 8, said comparator to compare a voltage on said capacitor to a reference voltage after coupling said cell across said capacitor.

10. The memory of claim 9, said comparator to allow a time period to elapse after connecting said capacitor across said cell before comparing said voltage across said capacitor to said reference voltage.

11. The memory of claim 8 including a comparator to compare a reference voltage intermediate between the states to be distinguished upon reading the cell to a voltage on said capacitor.

12. The memory of claim 8, said control to distinguish between levels of a multilevel cell.

13. The memory of claim 8, said control to distinguish between set and reset phase change memory states.

14. The memory of claim 8 wherein said capacitor is parasitic capacitance from the memory itself.

15. The memory of claim 8, said control to latch the value of the comparison between the voltage on the capacitor and the reference voltage.

16. A memory comprising:
a phase change memory cell;
a switch;
a controller to control said switch;
a capacitor selectively connectable by said switch across said memory cell; and
a charging circuit to charge said capacitor to a level intermediate between two cell states to be distinguished upon reading a cell.

17. The memory of claim 16 including a comparator to compare a voltage across said capacitor to a reference voltage.

18. The memory of claim 16 wherein said capacitor is parasitic capacitance from the memory itself.

19. The memory of claim 8 including a control to control the state of a first switch to couple said capacitor to said cell and a second switch to couple a voltage source to said capacitor.

* * * * *